United States Patent [19]

Fukuoka

[11] Patent Number: 4,639,830

[45] Date of Patent: Jan. 27, 1987

[54] PACKAGED ELECTRONIC DEVICE

[75] Inventor: Yoshitaka Fukuoka, Hamuramachi, Japan

[73] Assignee: Kabushiki Kaisha Toshiba, Kawasaki, Japan

[21] Appl. No.: 716,980

[22] Filed: Mar. 28, 1985

[30] Foreign Application Priority Data

Mar. 31, 1984 [JP] Japan .................................. 59-64747

[51] Int. Cl.$^4$ .............................................. H05K 1/03
[52] U.S. Cl. .................................. 361/411; 174/68.5;
174/52 PE; 361/402
[58] Field of Search ............... 361/397, 400, 402–403,
361/411–412, 414; 174/68.5, 124 G, 124 GC,
120 R, 122 G, 152 GM, 52 PE

[56] References Cited

U.S. PATENT DOCUMENTS

| 3,317,653 | 5/1967 | Layer, Jr. et al. ............... | 174/68.5 |
| 3,909,680 | 9/1975 | Tsunashima ..................... | 361/397 X |
| 4,237,606 | 12/1980 | Niwa et al. .................... | 174/68.5 X |
| 4,424,251 | 1/1984 | Sugishita et al. ............... | 174/68.5 X |
| 4,490,429 | 12/1984 | Tosaki et al. .................. | 174/68.5 X |

FOREIGN PATENT DOCUMENTS 54-6512  6/1979  Japan .

Primary Examiner—Arthur T. Grimley
Assistant Examiner—Jane K. Lau
Attorney, Agent, or Firm—Finnegan, Henderson, Farabow, Garrett & Dunner

[57] ABSTRACT

An electronic device having a thick film interconnection substrate of a multilayer configuration having a major surface on which conductor patterns for mounting thereon IC chips or the like elements and wiring conductor patterns are formed. A noncrystallizing glass layer is deposited on the major surface with the chip mounting conductor patterns being exposed while the wiring conductor patterns are covered. A crystallizing glass layer is formed on the noncrystallizing glass layer. The IC chips or other elements as mounted are packaged in a hardening composition layer. A device exhibiting an improved moisture proofness and thus a high reliability is realized.

5 Claims, 5 Drawing Figures

PACKAGED ELECTRONIC DEVICE

BACKGROUND OF THE INVENTION FILED OF THE INVENTION

The present invention relates to an electronic device which is composed of IC (integrated circuit) chips or other chip elements mounted on a thick-film multi-interconnection substrate and sealed on the top side through potting.

DESCRIPTION OF THE PRIOR ART

In recent years, there arises in various industrial fields a great demand for miniaturization, lightweight and high reliability of electronic instruments and apparatus or device. To meet the demand, various approaches have been made on the way to development of hybrid ICs.

As one of the methods of manufacturing the multi-layer interconnection substrate for use in realization of the hydrid IC, there can be mentioned a manufacturing method based on a thick film technology.

A typical one of the hitherto known methods of fabricating a hydrid IC is illustrated in FIGS. 1 and 2 of the accompanying drawings. Referring to these figures, a reference numeral 1 denotes a ceramic substrate on which a lower interconnection conductor layer 2a, a lower insulation layer 3a, an upper interconnection conductor layer 2b and an upper insulation layer 3b are formed in this order in a multilayer configuration through repeated printing, drying and firing processes to realize a thick film interconnection substrate. The interconnection conductor layers 2a and 2b may be made of an electrically conductive paste containing Au, PtAu, Ag, AgPd, Cu or the like as electrically conductive metal, while the insulation layers 3a and 3b may be made of a paste of crystallizing glass or the like.

Deposited on the topmost layer of the thick film interconnection substrate thus prepared are conductor patterns 4a and 4b, interconnecting conductor patterns 4c for forming electric connections between the IC chips mounted on the conductor patterns 4a, 4b and the thick film interconnection substrate, conductor patterns 4d for mounting input/output leads thereon, and wiring conductor patterns 4e for electrically interconnecting the conductor patterns 4a to 4d to one another in a desired manner.

The thick film interconnection substrate equiped with the chip elements such as IC chips or the like has to be subsequently sealed over the uppermost layer for protecting the chips and the like from adverse environmental influences.

For carrying out the sealing mentioned above, it is known to use a sealing metallic cap or a ceramic cap (not shown) with which the top surface of the thick film interconnection substrate is covered, wherein the cap and the substrate are fluid-tightly bonded along the joint or junction therebetween through welding or soldering.

The sealing method mentioned above can certainly assure a high reliability for the fluid-tightness. However, this method is disadvantageous in that the electronic device such as hybrid IC realized in this manner is expensive.

On the other hand, there is also known a sealing method which can reduce the manufacturing cost of the electronic device at the expense of more or less degradation in the reliability of sealing when compared with the aforementioned sealing method in which the cap is used. This method referred to as a resin or rubber sealing method essentially resides in depositing a hardening composition of fluid phase such as epoxy resin, silicone rubber or the like over the top surface of the thick film interconnection substrate having the chips such as IC chips mounted thereon through a potting process to thereby hermetically isolate the chip elements such as IC chips from the ambient atmosphere.

However, the sealing method resorting to the potting suffers a problem in respect to the reliability and in particular with regard to the wet or moisture proofness. More specifically, in the region of the surface of the thick film interconnection substrate where the space between the conductor patterns 4e is small, moisture will penetrate into the body of epoxy resin or silicone rubber deposited through potting, resulting often in the occurrence of short-circuit between the conductors 4e due to migration particularly when the conductor pattern 4e is formed of Ag or the like metal, to a serious disadvantage.

To evade the difficulty described above, it may occur, for example, that a paste of crystallizing glass used for forming the insulation layer is applied through printing of a paste of crystallizing glass over the surface region 5 (shown by dispersed dots in FIG. 1) of the multilayer substrate except for the regions where the conductor patterns 4a, 4b and 4c for mounting the chips and the conductor patterns 4d for the input/output leads are formed while covering the wiring conductor patterns 4e, the paste being then dried and fired.

However, the crystallizing-glass layer is inherently porous. Although it can exhibit an effective fluid-tightness only for a short period, moisture will penetrate through the crystallizing-glass layer in the course of time lapse and thus makes little contribution to realization of the improved moisture proofness.

Further, it is conceivable that a vitreous-glass or noncrystallizing glasslayer 6 used as overglaze color and exhibiting a high imperpeability to moisture is formed in the manner shown in FIG. 2 through printing, drying and firing processes, to thereby enhance the moisture proofness. However, this method also suffers a problem in that because of excessive smoothness of the surface of the vitreous glass layer 6, the hardening composition 10 such as epoxy resin, silicone rubber or the like deposited through potting and hardened after the packaging of the chip elements such as IC chips in the manner illustrated in FIG. 3 will be readily delaminated from the surface of the thick film interconnection substrate. In FIG. 3, a reference numeral 8 denotes a bonding agent layer for bonding the chip elements to the substrate, and 9 denotes bonding wires.

SUMMARY OF THE INVENTION

It is therefore an object of the present invention to provide a sealed electronic device or component which exhibits an improved moisture proofness and in which a hardening or setting composition such as epoxy resin, silicone rubber potted for sealing can be stably and firmly bonded to the thick film interconnection substrate, whereby the reliability of moisture proofness is significantly improved.

Another object of the present invention is to provide a sealed electronic device or component which is inexpensive when compared with those sealed by using a metal cap or a ceramic cap.

Still another object of the present invention is to provide a sealed or packaged electronic device or component in which an enhanced adhesion can be realized between the resin or rubber used for the sealing and the relevant surface of the thick film interconnection substrate.

In view of the above and other objects which will be apparent as description proceeds, there is provided according to an aspect of the invention an electronic part or device which comprises a thick film interconnection substrate, a vitreous-glass or noncrystallizing glass layer formed in intimate contact over the surface of the substrate except for those surface regions where conductor patterns for mounting IC chips and other elements are provided, while covering the other conductor patterns, a crystallizing glass layer formed on the noncrystallizing glass layer, the IC chips and/or other elements mounted on the thick film interconnection substrate at the regions where the noncrystallizing glass layer and the crystallizing glass layer are not formed, and a resin or rubber composition layer formed on the crystallizing glass layer so as to cover the IC chips and/or other elements, the resin or rubber composition being deposited through potting and hardened.

By virtue of the above mentioned structure according to the invention in which the wiring conductor patterns formed on the major surface of the substrate for interconnecting the circuit components such as IC chips are covered by the vitreous glass layer or noncrystallizing glass layer which exhibits a high impermeablility to moisture, short-circuit failure due to migration is positively prevented from occurrence between the interconnecting or wiring conductor patterns even in case the latter are formed of Ag or like metal. Further, since the crystallizing glass layer formed on the noncrystallizing (vitreous) glass layer presents a rough surface, adhesion of the potted sealing material is significantly improved.

BRIEF DESCRIPTION OF THE DRAWINGS

The above and other object, features and advantages of the present invention will be more apparent from the following description of the preferred embodiments taken in conjunction with the accompanying drawings, in which.

DETAILED DESCRIPTION OF THE PREFFRRED EMBODIMENTS

Figure 1:
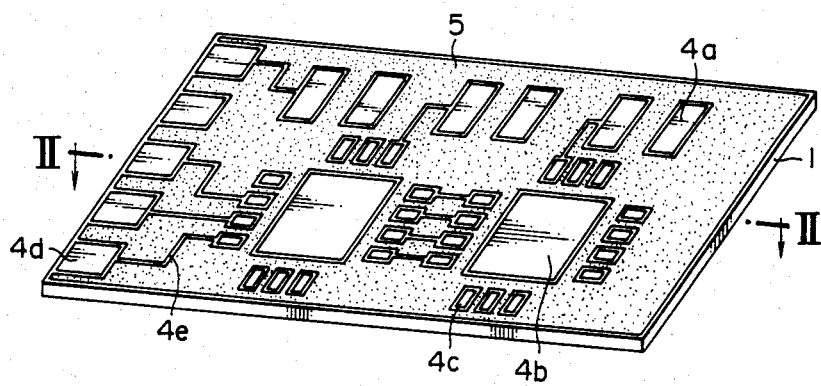
FIG. 1 shows in a perspective view a thick film interconnection substrate employed in a hitherto known resin-sealed electronic part or device.

Now, the invention will be described in more detail in conjunction with the preferred embodiments thereof by referring to the drawings.

Figure 2:
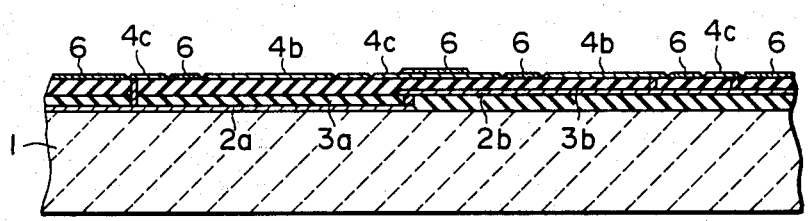
FIG. 2 is a sectional view of the same.
Figure 3:
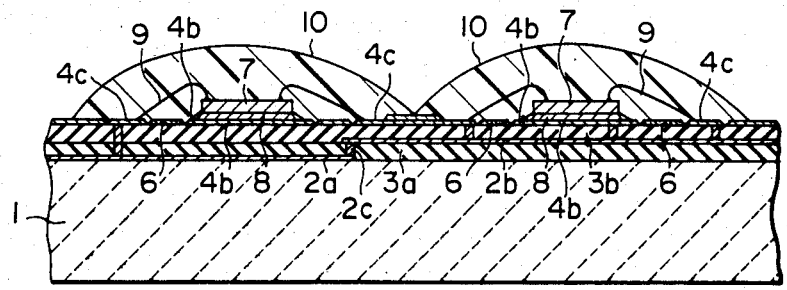
FIG. 3 is a sectional view showing a hitherto known electronic part or device sealed by a resin layer after the chip elements such as IC chips have been mounted on the thick film interconnection substrate.
Figure 4:
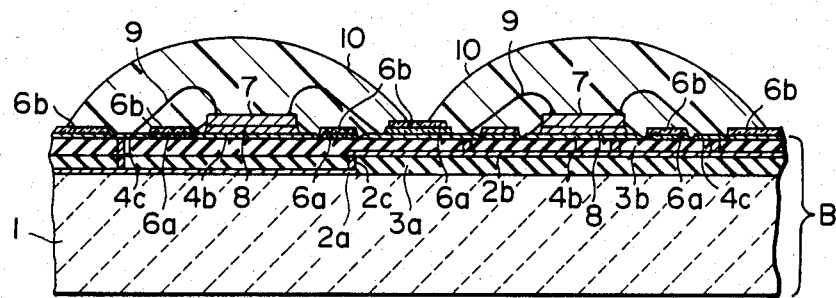
FIG. 4 is a sectional view showing a structure of an electronic part or device according to an exemplary embodiment of the invention.

FIG. 4 shows in a sectional view an electronic device according to an exemplary embodiment of the present invention. In the figure, parts equivalent to those shown in FIGS. 1 to 3 are designated by like reference symbols.

Referring to FIG. 4, there are formed on a substrate 1 of ceramic such as alumina or the like a lower interconnection conductor layer 2a, a lower insulation layer 3a, an upper interconnection conductor layer 2b, and an upper insulation layer 3b having a surface formed with conductor patterns, being stacked in this order as observed from the substrate 1, to thereby constitute a thick film multilayer interconnection substrate B. A noncrystallizing glass layer 6a having a thickness of 10 to 30 μm is formed on the insulation layer 3b except for the regions where the surface conductor patterns 4a to 4d for mounting thereon the IC chips or the like elements are formed while covering the regions where the other conductor patterns 4e are formed. A crystallizing glass layer 6b is formed in thickness of 10 to 30 μm over the noncrystallizing glass layer 6a. The IC elements 7 such as IC chips or the like are mounted on the conductor patterns 4a and 4b. A hardening resin composition layer 10 is deposited over the top surface of the multilayer substrate through potting, whereby the electronic device is completed.

The electronic device of the structure described above may be manufactured through a process mentioned below.

At first, the lower interconnection conductor layer 2a is formed on the cermanic substrate 1 of alumina or the like by applying an electrically conductive paste containing Au, PtAu, Ag, AgPd, Cu or the like, which is followed by formation of the lower insulation layer 3a by applying a paste of crystallizing glass. It is to be noted that through-holes are formed in the lower insulation layer 3a. Subsequently, the upper interconnection conductor layer 2b are formed of an electrically conductive paste. In the course of formation of this layer 2b, interconnecting conductors 2c are formed through the through-holes for electrically connecting the upper interconnection conductor layer 2b and the lower interconnection conductor layer 2a to each other.

In the similar manner, there is formed on the upper interconnection conductor layer 2b the upper insulation layer 3b having through-holes formed therein. The surface conductor patterns are then formed on the upper insulation layer 3b with interconnecting conductors being simultaneously formed through the through-holes for electrically connecting the surface conductor patterns to the upper interconnection conductor layer 2b.

Formed over the surface of the upper insulation layer 3b except for the surface regions where the conductor patterns 4a to 4d destined for mounting IC or the like chip elements is the noncrystallizing glass layer 6a filled with glass filler of an overglaze type having a softening point in a range of ca. 800° to ca. 850° C. and formed thereon is the crystallizing glass layer 6b having a softening point of ca. 900° to ca. 950° C. For formation of the noncrystallizing glass layer 6a, there may be employed a glass paste commercially available from Dupont Co. under the trade name "π8190" or from ESL Co. under the trade name "π4904". For forming the crystallizing glass layer, a paste commercially available from Dupon Co. under the trade name "π9805" or "π9950" from ESL Co. under the trade name "#4608" or "#4905" may be used. The glass layers 6a and 6b can be formed through printing, drying and firing processes.

Next, IC chips or the like elements 7 are mounted on the conductor patterns 4a and 4b of the surface conductor layer by using an electrically conducting bonding agent such as of epoxy type. Subsequently, electrical connection of terminal pads of the chip elements to the conductor patterns 4c on the substrate are made by using bonding wires 9 made of Au or Al, for example.

On the other hand, input/output leads are mounted on the conductor patterns 4d (not shown in FIG. 4) by using a bonding agent such as electrically conductive resin, solder or the like.

Finally, the hardening or setting composition 10 such as epoxy resin, silicone rubber of RTV type or the like is applied through potting to thereby package the IC chips 7, bonding wires 9 and the base potion of the input/output leads for isolating or shielding them from the ambient atmosphere.

Figure 5:
FIG. 5 is a sectional view showing another embodiment of the electronic device according to the invention.

FIG. 5 shows in a sectional view an electronic device according to another embodiment of the invention, which differs from the device shown in FIG. 4 only in respect that the regions where the hardening composition is deposited through potting.

More specifically, in the case of the structure shown in FIG. 5, the whole surface of the multilayer substrate inclusive of the bottom surface of the ceramic substrate 1 but exclusive of the regions corresponding to the input/output leads are packaged in the hardening composition through potting. This structure can assure a higher reliability of the electronic device when compared with the embodiment shown in FIG. 4.

What is claimed is:

1. An electronic device comprising a thick film, multilayer interconnection substrate on which wiring conductor patterns, conductor patterns for connecting input/output leads, conductor patterns for mounting integrated circuit chips and the like and wiring are formed, a noncrystallizing glass formed on said substrate, except for said conductor patterns for connecting input/output leads, said conductor patterns for mounting integrated chips and the like and said wiring, a crystallizing glass layer formed on said noncrystallizing glass layer and a hardening composition potted on said crystallizing glass layer to cover said conductor patterns for connecting input/output leads, said conductor patterns for mounting integrated circuit chips and the like and said wiring.

2. An electronic device according to claim 1, wherein said noncrystallizing glass layer has a thickness of 10 to 30 μm.

3. An electronic device according to claim 1, wherein said crystallizing glass layer has a thickness of 10 to 30 μm.

4. An electronic device according to claim 1, wherein said wiring conductor patterns are formed of an electrically conductive paste of silver series.

5. An electronic device according to claim 1, wherein said hardening composition is selected from the group consisting of epoxy resin and silicone rubber.

* * * * *